United States Patent [19]

Baron et al.

[11] 4,321,583

[45] Mar. 23, 1982

[54] ANALOGUE TO DIGITAL CONVERTER CHANNELS

[75] Inventors: John R. Baron, Winchmore Hill; Robert K. Coggan, Luton, both of England

[73] Assignee: British Aerospace Public Company, Limited, Weybridge, England

[21] Appl. No.: 43,705

[22] Filed: May 30, 1979

[30] Foreign Application Priority Data

May 31, 1978 [GB] United Kingdom ............... 25708/78

[51] Int. Cl.³ ........................................... H03K 13/02
[52] U.S. Cl. ............................... 340/347 CC; 324/130
[58] Field of Search ................. 340/347 CC, 347 AD; 324/130

[56] References Cited

U.S. PATENT DOCUMENTS

| | | | |
|---|---|---|---|
| 3,070,786 | 12/1962 | MacIntyre | 340/347 CC |
| 3,145,376 | 8/1964 | Currie | 340/347 CC |
| 3,148,366 | 9/1964 | Schulz | 340/347 CC |
| 3,491,295 | 1/1970 | Van Saun | 340/347 CC |
| 3,889,255 | 6/1975 | Pettersen | 324/130 |

Primary Examiner—Charles D. Miller
Attorney, Agent, or Firm—Oblon, Fisher, Spivak, McClelland & Maier

[57] ABSTRACT

This is an analogue to digital converter channel including an analogue multiplexer, a switched gain amplifier, a mode amplifier, a sample and hold stage, and an analogue to digital converter. Off-set errors can be precalculated and then corrected for by switching the input to the amplifiers to null, and storing the output from the converter, and the amplified output from the gain amplifier respectively at 'X' and 'Y' and then combining those stored off-set error signals at an adding circuit at the input to the converter during a subsequent analogue to digital conversion.

6 Claims, 1 Drawing Figure

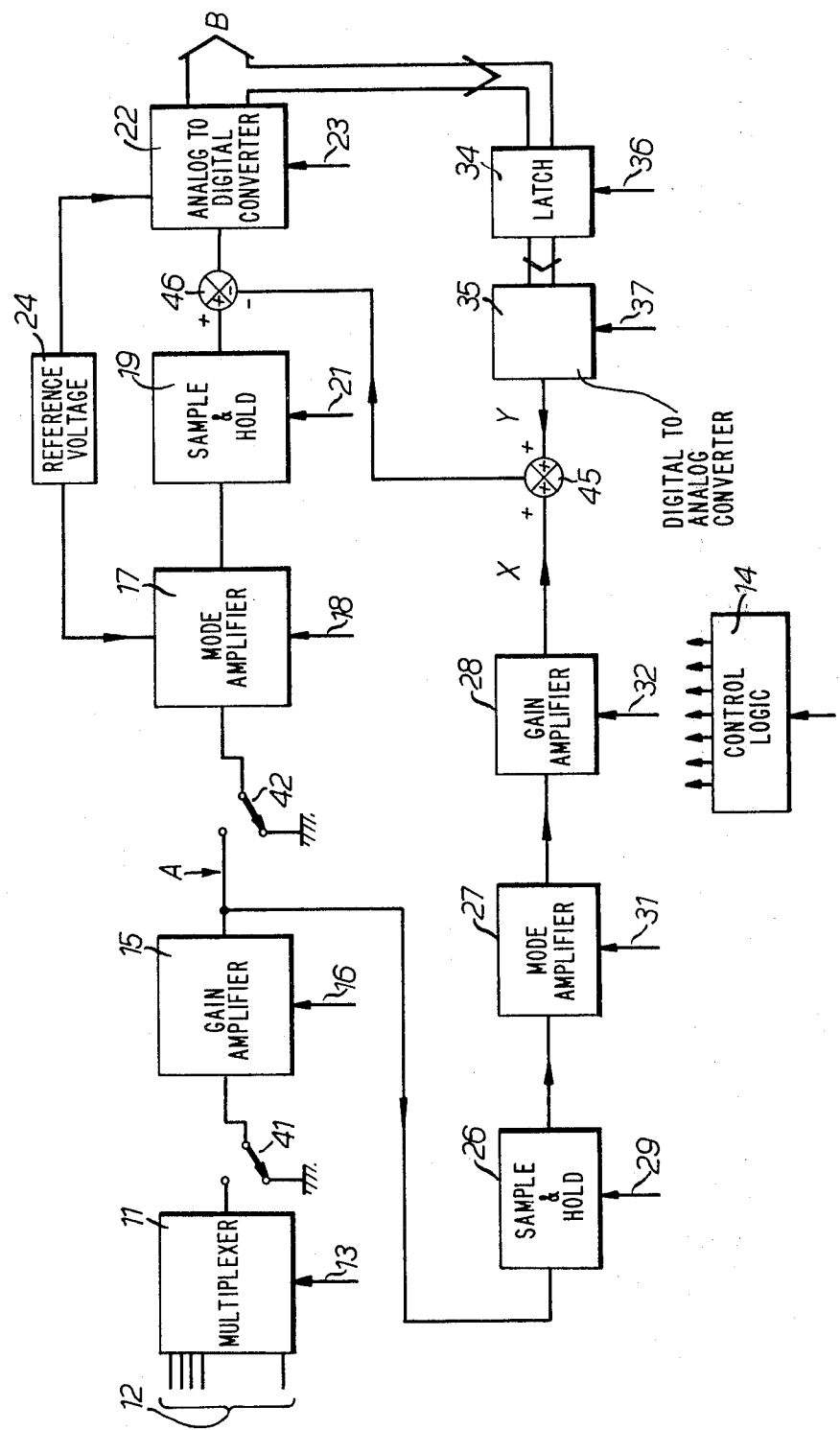

ANALOGUE TO DIGITAL CONVERTER CHANNELS

This invention relates to analogue to digital converter channels, for example channels capable of handling analogue signals with different ranges of amplitude and with different polarities.

An object of the invention is to provide means for at least partly nulling off-set errors due to component manufacturing tolerances and component value variations with temperature changes and with age so that commercial quality components can be used and yet accurate conversion can be achieved.

According to the present invention, an analogue to digital converter channel includes an analogue to digital converter and at least one nulling circuit arranged to store an output from a part of the converter when that part has a null input and to add the stored output to the converter during a subsequent conversion of an analogue input.

Constant off-set error can be corrected by one nulling circuit which stores the digital output from the converter, and includes a digital to analogue converter arranged to derive from the stored digital output a nulling analogue signal, which is then added to the input to the analogue to digital converter.

Where the converter channel has a switched-gain amplifier, so that it can handle analogue inputs with different amplitude ranges and there is an off-set error which depends upon the gain set, then a nulling circuit can store the output from the amplifier when the amplifier has a null input, and during a subsequent conversion of an analogue input the stored output is amplified in sympathy with the analogue input to produce a gain dependent nulling signal which is added to the converter channel upstream of the analogue to digital converter.

A combination of the two types of nulling circuit can be used to nullify both the constant and the non-constant off-set errors.

An advantage of the invention is that the errors can be measured and correcting signals determined and stored for subsequent use during analogue conversion. Thus, if control logic is arranged automatically to perform nulling error measurement cycles, and then to perform analogue to digital conversions, the corrections can be automatic without requiring manual resetting of components.

The invention may be carried into practice in various ways, and one embodiment will now be described by way of example, with reference to the accompanying drawing, of which the single FIGURE is a block circuit diagram of an analogue to digital converter including an automatic nulling circuit.

The main analogue to digital converter channel includes a multiplexer 11 capable of receiving any of a number of analogue inputs at 12 in dependence on a control signal provided at 13 from an overall control logic unit 14, a switched gain amplifier 15 controlled at 16 from the control logic 14, to scale up the particular analogue input at 12, so as to make the most efficient use of the range of the converter, a mode amplifier 17 controlled at 18 from the logic 14 in accordance with the polarity of the analogue input at 12, a sample and hold stage 19 control at 21 from the logic 14 so as to hold the analogue signal it receives at its input constant during an analogue to digital conversion operation, and an analogue to digital converter 22 controlled at 23 from the logic 14 so as to produce a digital output at 'B' following the conversion period set by the logic 14.

That main converter channel shows imperfection in unwanted off-set voltages which together show an error in the digital output so that the output is not zero when the analogue input is zero. This error is known as "off-set error". It applies constantly over the full range of analogue inputs and may be additive or subtractive. It is made up of four components.

There is an off-set voltage at the output 'A' from the switched gain amplifier 15, which is a function of the particular gain selected, and so is not constant. That off-set voltage at 'A' is further modified by the mode amplifier 17.

An off-set voltage arises in the mode amplifier 17 due to tolerance of the circuit components and variations in the reference voltage applied to the mode amplifier 17 from a source 24. This off-set voltage is constant because the gain of the mode amplifier is constant.

An off-set voltage arises in the sample and hold stage 19, due to a transient charge transfer into the hold capacitor, and this off-set is constant.

Finally an off-set is produced in the converter 22 due to imperfections in the internal comparator switch leakage currents, and this off-set is constant.

Each of the off-set values will depend upon the manufacturing tolerances and can be measured at starting of the system, but the values will be modified in use by aging and by operating temperature.

The total off-set error can be very significant in high accuracy analogue to digital converters and is not easily overcome by precision trimming during manufacture, component selection, or manual pre-set adjustment at setting up.

In accordance with the invention, the two components of the off-set error, namely the error up to 'A' which depends upon the selected gain of the amplifier 15, and the constant error between 'A' and 'B' are compensated for by respective measuring and storage systems.

The non-constant error uses a storage system consisting of a sample and hold stage 26 receiving at its input the output of the switched gain amplifier 15, a mode amplifier 27, and a switched gain amplifier 28, and each of those units is controlled at 29, 31 and 32, from the overall control logic 14.

The measuring and storage system for the constant error from 'A' to 'B' includes a latch 34 for holding an output at 'B' from the analogue to digital converter 22, and a digital-to-analogue converter 35, and again each of those components is controlled at 36 and 37 from the logic 14.

Before the main converter channel is used to process an analogue input at 12, a nulling command cycle is initiated by the logic 14, and that has the effect of switching the input to the switched gain amplifier 15 at 41, and the input to the mode amplifier 17 at 42, to earth potential or null input, at which the off-set error will appear as the output.

Thus, in the first measuring storage system, with the gain of the switched gain amplifier 15 set at a high value of, say, 200, then if the off-set voltage in the amplifier 15 is '$e_1$' a voltage of $200e_1$ at 'A' will be delivered to the input of the sample and hold stage 26. The choice of the gain of the amplifier 15 is such that it will swamp any off-set peculiar to the storage system 26, 27, and 28. The signal $200e_1$ is stored in the sample and hold stage 26 and processed by the mode amplifier 27 and switched gain amplifier 28 in a similar manner to the operation in the main converter channel 15, 17, 19. A gain dependent nulling voltage is produced at 'X' for nulling the off-set error produced in the switched-gain amplifier 15.

During the nulling command cycle, with the mode amplifier 17 having a null input at 42, the digital output at 'B' represents the total of all the fixed off-set errors, and that number is stored in the latch 34 under control from the logic 14. In fact the off-set error is small producing a small digital number so that only the lower significant bits of the number need to be stored in the latch. The stored number is reconverted to an analogue voltage at 'Y' in the converter 35 and then the two error voltages at 'X' and 'Y' are combined algebraically in an adding circuit 45, the output of which is added to the input to the main analogue to digital converter 22, algebraically in an adding circuit 46.

When the main converter channel is used to convert analogue inputs at 12, the off-set error corrections will be automatically applied at 46, because the latch 34 holds the constant nulling signal, and the switched-gain amplifier 28 and the mode amplifier 27 are switched in sympathy with the main amplifier 15 and mode amplifier 17. The sample and hold stage 26 can be controlled to hold a previously measured amplified off-set error signal.

However, if preferred, the nulling command cycle can be performed under control of the logic 14, before every new input is applied to the analogue multiplexer 11. Alternatively, a nulling command cycle can be initiated from time to time to re-set the correction voltages in dependence upon changing operating temperature, and ageing of component.

The off-set errors will be correctly nulled out of succeeding analogue to digital conversions irrespective of the selected gain and mode in the main channel.

It should be noted that since the fixed part of the correction signal is derived from the output of the main analogue to digital converter 22 that error can only be resolved to the resolution of the main converter. However, that converter will be a high accuracy converter, because it is only with high accuracy converters that the off-set errors are significant.

What we claim as our invention and desire to secure by Letters Patent is:

1. A signal transmission system including a converter channel having a switched gain amplifier and an analogue to digital converter and a nulling circuit for storing the output from said amplifier when the amplifier has a null input, and a second switched gaine amplifier for amplifying the stored output, and logic means arranged during a subsequent conversion of the analog input, to cause the stored output to be amplified in said second amplifier in sympathy with the analog input for producing a gain-dependant nulling signal and means for adding the gain-dependent nulling signal to the converter channel upstream of the analogue-to-digital converter.

2. A signal transmission system as claimed in claim 1 including a second nulling circuit for storing the digital output from the converter when the converter has a null input, and including a digital to analogue converter arranged to derive from the stored digital output a nulling analogue signal, and means for adding the nulling analogue signal to the input to the analogue to digital converter during a subsequent conversion of an analogue input.

3. A signal transmission system as claimed in claim 2, including means for adding the nulling analogue signal and the gain dependent nulling signal together and to the input to the analogue to digital converter.

4. A signal transmission system as claimed in claims 1, 2 or 3 including a mode selector between the analogue input and the analogue-to-digital converter, and a second mode selector in the nulling circuit which produces the gain-dependant nulling signal said mode selectors being controlled by the logic means in accordance with a plural input to the converter channel.

5. A signal transmission system as claimed in claim 1, 2 or 3, including a logic circuit for controlling components of the converter channel and the nulling circuit, for ordering a nulling cycle prior to an analogue input conversion, in which cycle a part of the system has a null input and the output from it is stored, the logic circuit also acting to order a subsequent analogue input conversion and to add the stored output into the system.

6. A signal transmission system as claimed in claim 1, 2 or 3, including a mode selector between the analogue input and the analogue-to-digital converter, and a second mode selecter in the nulling circuit which produces the gain-dependent nulling signal, and including a logic circuit for controlling components of the converter channel and the nulling circuit for ordering a nulling cycle prior to an analogue input conversion in which cycle a part of the system has a null input and the output from it is stored, the logic circuit also acting to order a subsequent analogue input conversion and to add the stored output into the system.

* * * * *